United States Patent [19]

Lenz et al.

[11] 4,017,183
[45] Apr. 12, 1977

[54] APPARATUS FOR THE PRODUCTION OF EXPOSED PRINTING PLATES

[75] Inventors: Werner Lenz; Josef Woellhaf, both of Ludwigshafen; Klaus Spreng, Weisenheim; Manfred Zuerger, Mannheim; Paul Hecke, Ludwigshafen; Gerhard Hoffmann, Speyer; Milan Obradovic, Bruehl, all of Germany

[73] Assignee: BASF Aktiengesellschaft, Ludwigshafen, Germany

[22] Filed: Feb. 19, 1975

[21] Appl. No.: 550,913

[30] Foreign Application Priority Data

Feb. 23, 1974 Germany ............................ 2408748

[52] U.S. Cl. .................................. 355/85; 355/133
[51] Int. Cl.² ......................................... G03B 27/04
[58] Field of Search ................. 355/85, 86, 87, 78, 355/133

[56] References Cited

UNITED STATES PATENTS

| 3,520,606 | 7/1970 | Gush et al. | 355/85 |
| 3,597,080 | 8/1971 | Gush et al. | 355/85 |
| 3,813,162 | 5/1974 | Watabe et al. | 355/85 |

*Primary Examiner*—Richard L. Moses
*Attorney, Agent, or Firm*—Johnston, Keil, Thompson & Shurtleff

[57] ABSTRACT

A process and apparatus for the production of exposed printing plates consisting of a resin layer and a support, said resin layer being prepared from a fluid photopolymerizable material which is introduced into a mold having at least one transparent wall which is covered with an image-bearing transparency, and being exposed through said image-bearing transparency, which causes photopolymerization of the exposed areas of the resin layer and bonds these areas to the support which is provided with an adhesive layer. The improved process comprises introducing a predetermined amount of fluid photopolymerizable material, said amount corresponding substantially to the volume of the resin layer of the exposed printing plate; adjusting said support and said transparent wall of the mold so that they are equidistant from one another, adjustment being advantageously effected by bending or doming the support relative to the transparent wall after the latter has been bent or domed by the fluid material introduced into the mold under pressure. Further embodiments of the invention serve to minimize the loss of photopolymerizable material and to avoid the formation of foam when the fluid material is introduced into the mold. The apparatus of the invention can be manufactured and operated easily and economically.

14 Claims, 4 Drawing Figures

APPARATUS FOR THE PRODUCTION OF EXPOSED PRINTING PLATES

This application discloses and claims subject matter described in German patent application No. P 24, 08, 748.7, filed Feb. 23, 1974, which is incorporated herein by reference.

The invention relates to a process and apparatus for the production of exposed printing plates consisting of a resin layer and a support, said resin layer being prepared from a fluid photopolymerizable material in the form of a resin or a resin monomer mixture, of which a predetermined amount is introduced under pressure into a mold comprising a glass plate as one wall which carries an image-bearing transparency and is covered with a transparent plastics film, and is uniformly distributed therein, the resin layer then being exposed to actinic light through the glass plate, which causes photopolymerization of the exposed areas of the resin layer and bonds these areas to the support which is provided with a layer of adhesive. The non-exposed areas are then removed in a conventional manner to give the finished printing plate.

Processes and apparatus of this type have been developed in recent years and some manufacturers have already started to market appropriate equipment. The object of manufacturing the printing plate in its entirety immediately prior to use is to lower the price per plate and hence to increase market penetration of photopolymer printing plates.

German Published Application (DOS) No. 2,316,401 discloses an apparatus for the manufacture of a printing plate comprising a resin layer using the procedural steps described above. The amount of resin introduced into the mold is measured by a metering device, but the amount of resin required for the production of a printing plate of a particular size and thickness is at least 25% greater than that required to fill the mold. As a result, the mold must be provided with overflow means if plates of approximately the same thickness are to be manufactured satisfactorily. This excess resin produces considerable soiling of the film and of the overflow means on the apparatus, which in turn causes processing difficulties and makes additional maintenance work neccessary. Furthermore, the loss of resin adds to the cost of producing the printing plate. In addition, the apparatus which has been described only permits the production of printing plates which are larger than ultimately required, since the thickness of the layer is not constant in the peripheral zones. As a result, the finished plate must be trimmed all round the edge, thus producing scrap. The disadvantages described above apply to all the known processes and apparatus of the type in question.

The said German application also discloses that the support is bent by hand into the shape of an inverted arch and, after the resin has been introduced into the mold of the apparatus, the crown of the arch is brought into contact with the resin, which has not yet been distributed, and the support is then allowed to return by hand to its original flat shape. As a result of these measures, the support can be placed on the resin without the formation of foam therebetween. The resin is distrubuted inside the mold, after closure thereof, by means of a bellows to which compressed air is supplied and which is arranged beneath a hollow structure supporting the glass plate, the upper wall of the mold merely serving as a counterpressure plate. After the resin has been distributed, exposure is effected through the glass plate, which has resumed its original flat shape, with the support in its flat state. In view of the labour-intensive operation of the apparatus dead times occur during the production of the printing plate, which result in considerable costs, particularly in the case of newspaper printing.

German Published Application (DOS) No. 2,323,916 describes a further apparatus of the above type, in which, before the resin is introduced into the mold, the support is pressed down onto the sides of the mold by a press plate to seal the mold hermetically from the atmosphere, the height of the mold corresponding exactly to the thickness of the resin layer to be manufactured. This application further states that the glass plate is bent or domed by the pressure under which the material is introduced. After exposure, the hermetically sealed mold is opened by moving the press plate upwards. The press plate thus merely serves as a lid.

In the latter case, the fluid resin is introduced into the mold from three sides via a channel, which makes the apparatus more expensive to manufacture and hardly saves time.

The known apparatus are furthermore designed for use with resins of high viscosity only, so that they must be provided with heating means.

It is an object of the present invention to simplify and improve the known processes and apparatus so as to simplify operation, reduce the time required to manufacture a printing plate, and enable the apparatus to be manufactured, and operated, at low cost. It is a further object of the invention to improve the resin layers used to produce the printing plates.

These objects are achieved by a process of the above type wherein the support is bent or domed, in a direction at right angles to the plane of the glass plate, essentially immediately after the introduction of a predetermined amount of resin, so that the dome shape of the glass plate is compensated for and maintained, i.e. the bent or domed surface of the support is equidistant from the bent or domed surface of the glass plate and the distance between the said two surfaces is maintained, during exposure. Bending or doming of the support prevents complete recovery of the glass plate.

The invention makes it possible to produce resin layers to close tolerances on thickness quickly and economically. The cycle times for the production of the plates can be considerably shortened by using these measures without the operator having to carry out more than the usual hand movements. The process is not restricted to resins or resin mixtures having a specific viscosity but can be successfully used with various types of resin having a wide range of viscosities.

The said objects can be achieved very advantageously by introducing a predetermined amount of the fluid resin, which substantially corresponds to the volume of the resin layer to be produced, i.e. essentially without any excess, into a substantially sealed mold, the dimensions of the base of which correspond essentially to the dimensions of the printing plate to be produced.

The advantage of this procedural step is that no resin, or at most very little resin, is lost, which might soil the film which has to be removed manually from the layer after the latter has been produced and exposed. Since the resins generally used cause skin irritation and can also greatly handicap the operator's work in other respects, this is considered to represent a considerable advance in the art. Furthermore, a substantial amount of resin can be saved as compared with known processes. As a result of the mold being charged with essentially the correct amount of resin, subsequent trimming of the printing plate produces virtually no scrap. In addition, the layers produced are of very uniform thickness, so that rejects are substantially avoided. Since soiling of the apparatus is substantially avoided, less maintenance is required.

The invention encompasses other advantageous embodiments. For example, it is possible to achieve particularly uniform distribution of the resin in the mold by appropriately guiding the flow of resin, thereby avoiding the use of expensive anti-foam agents, and to optimize the operational procedure by measuring the temperature and/or the degree of bending or doming of the glass plate and utilizing the measurements for, for example, temperature or pressure control.

Advantageous apparatus for carrying out the process according to the invention comprise a metering and filling device for the fluid resin, a first structural member which carries the glass plate and a second structural member on which the support is mounted, the said members being movable relative to one another to form a mold for the resin which is to be introduced, at least one source of actinic radiation located in such a way that the resin layer can be exposed through the glass plate, and means for bending or doming the support, which means is provided on the second structural member and with the aid of which the bent or domed shape of the glass plate can be maintained after the resin has been introduced into the mold and distributed therein.

In a further advantageous embodiment of the apparatus of the invention, the side wall of the mold located in the immediate vicinity of the feed channel for the resin is in the form of a sealing strip when the two structural members are in the closed position, and the other side walls, which form a rectangle with the sealing strip, are in the form of strips of conventional spring steel of the same thickness, the side wall which is parallel to the sealing strip being composed of one or more strips arranged next to each other, and gaps for allowing the air to escape from the mold being provided at each end of the wall and between adjacent pairs of strips.

The main advantages offered by the features of the apparatus of the invention, which features represent an advance in the art, when taken alone or in combination, are that in the main commercially available components and pieces of equipment can be used, and that the apparatus is of simple design and easy and safe to operate.

Further advantageous embodiments of the apparatus according to the invention relate to the design and arrangement of the said two structural members, for example hinge means for these, means for closing and locking the said two structural members without them being distorted to produce a reproducible identical mold for the fluid resin, the design of the mold itself, ancillary equipment for supplying a plastics film and freeing it from static electricity, and sensors for determining the degree of doming and temperature of the glass plate, as well as to proposals for using the data determined by the said sensors, for example to control the duration and/or magnitude of the pressure applied to the support and/or to control the temperature of the resin solution before it is introduced into the mold.

Further details of the process and apparatus of the invention are disclosed in the following description of the embodiments shown in the accompanying drawings, in which FIG. 1 is a perspective schematic view of an apparatus according to the invention;

Figure 1:
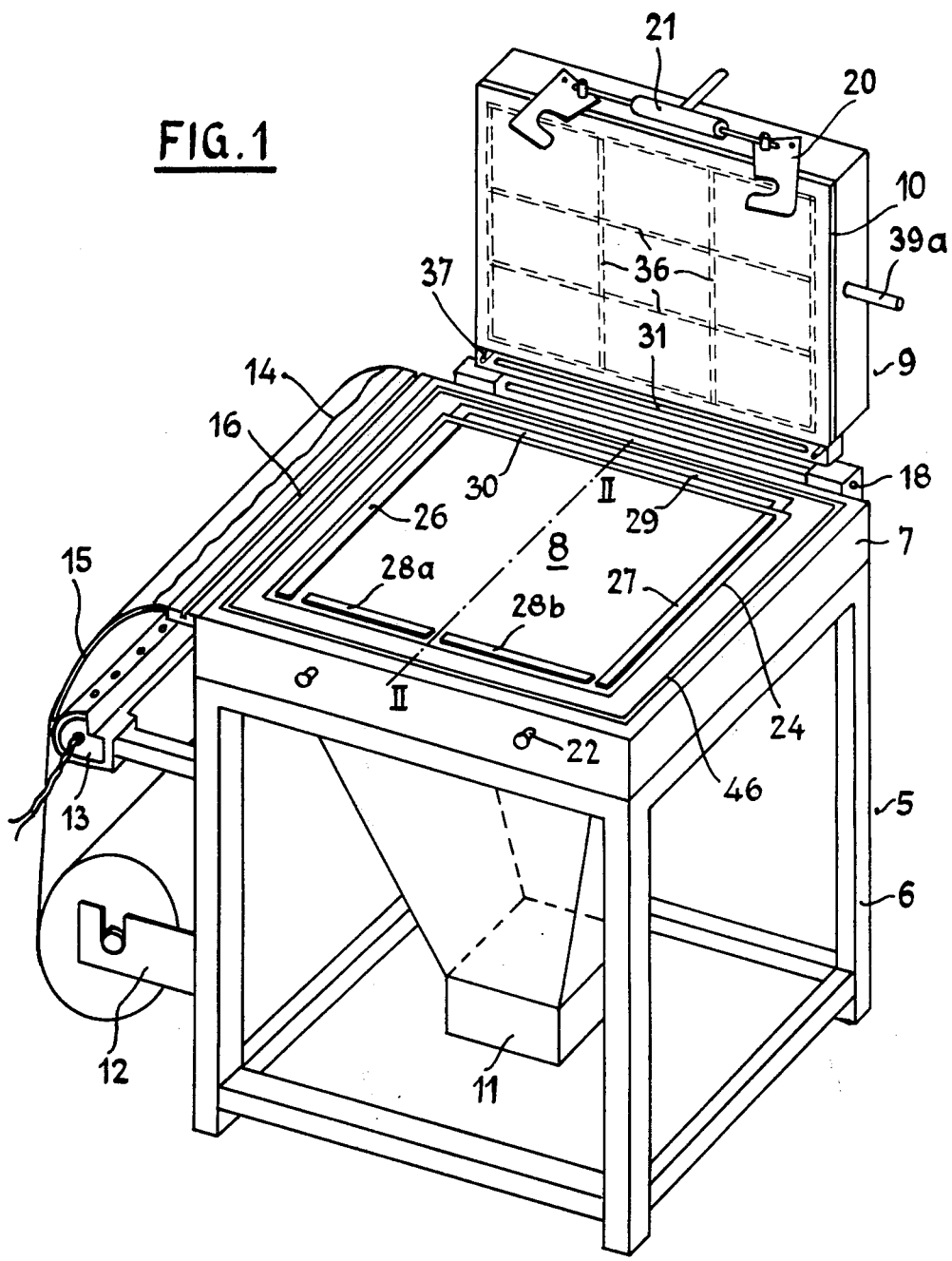

The apparatus 5 consists essentially of a stand 6, which carries the first structural member 7 together with the glass plate 8, and of the second structural member 9, which essentially serves as a mount for a support 10 for the printing plate which is to be produced. The members 7 and 9 can be moved relative to one another, and any desired means, e.g. pneumatic or hydraulic cylinders, can be used for this purpose. In the apparatus shown, the structural member 7 is in the form of a rigid frame and the structural member 9 in the form of a lid; the structural members 7 and 9 will be referred to hereinafter as the frame and lid respectively. When the apparatus is in operation, the frame 7, which supports and holds the glass plate 8, remains in its horizontal position or is preferably inclined so as to ensure that any air bubbles adhering to the film 14 inside the mold can escape when the resin is introduced. In principle it is possible to expose the resin layer from the side, or from above, after the frame 7 together with the lid 9 have been tilted into the appropriate position.

In the apparatus shown, a light source 11 (shown schematically in the drawing), wich emits actinic radiation in the wavelength range of from 200 to 700 m$\mu$ and is surrounded by a screen provided with a reflecting surface, is located below the frame 7. In addition, a holder 12 for a roll of plastics film, an ionization device 13 for freeing the film 14 from static electricity and a film guide 15 are mounted on the stand 6. There is also provided a slot 16 for guiding a knife for cutting the film 14 in a transverse direction.

Figure 2:
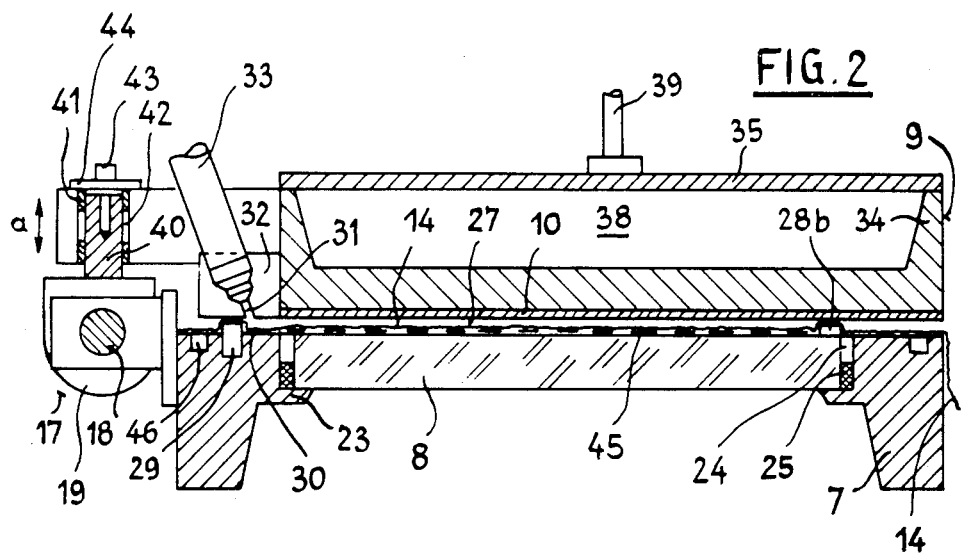
FIG. 2 is a sectional view, taken along line II—II of FIG. 1, of the first and second structural members in the closed position, and a view of one of the hinge assemblies for the said two members.
Figure 4:
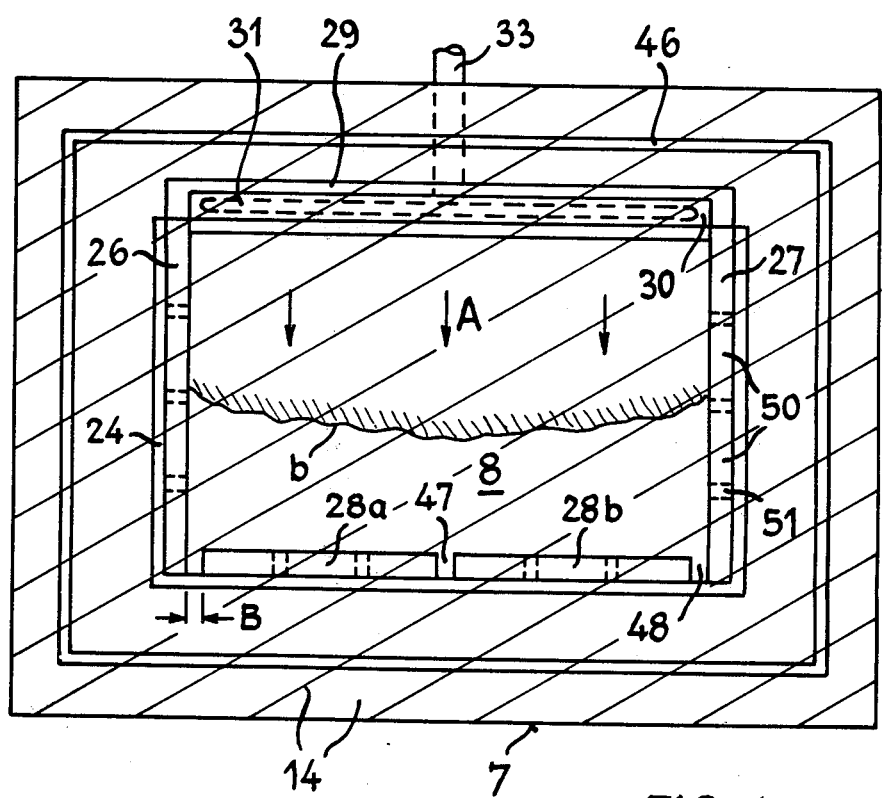
FIG. 4 is a plan view of the first structural member together with the glass plate.

Two hinge assemblies 17 each comprising a connecting member 19, the swing bearing of which is mounted on a fixed rod 18, are provided between the frame 7 and lid 9 (cf. FIG. 2). Hooks 20, serving as locking means, are mounted on the lid 9 and can be pivoted toward one another, by means of the cylinder 21 and associated pistons, to engage pegs or rolls 22 provided on the frame after the lid has been closed. Of course, the hooks 20 or other suitable locking means can also be operated manually. What is important in every case is that the frame 7 and lid 9 should close without being distorted. As shown in FIG. 2, the glass plate 8 is located in the frame 7 on a rigid ledge 23. The upper surface of the glass plate 8 is substantially flush with the top of the frame 7. The groove 24 is about half-filled with an elastic material, for example with an elastomeric profile 25, which acts as a seal, correctly positions the glass plate in the frame and compensates for tolerances in the glass plate. Spacer strips 26, 27 and 28a and 28b made, for example, of spring steel are arranged along three sides of the glass plate. The thickness of the strips 26, 27, 28a and 28b determines the thickness of the resin layer to be produced which can be from about 0.1 to 2 mm for printing purposes. The fourth side of the glass plate is not provided with a spacer strip. The above strips are detachably affixed to the glass plate by suitable means, for example adhesives or magnets; double-sided adhesive tapes have proved outstandingly suitable for this purpose. Preferably, pieces of adhesive tape 50, about 4 cm long and from 0.1 to 0.3 mm, preferably 0.2 mm, thick, shown in dashed lines in FIG. 4, are used. Gaps 51, a few millimeters wide, between the pieces of adhesive tape 50 enable any air trapped between (a) the film and the imagebearing transparency and (b) image-bearing transparency and the glass plate to be evacuated.

A sealing strip 29, which is let into the top of the frame 7, is arranged at a distance from, and parallel to, the fourth side of the glass plate 8, where no spacer strip of the above type is provided. The upper edge of the sealing strip 29 must be higher than the upper surface of the spacer strips which can be, for example, 0.5 mm thick. In plan view (cf. FIG. 4), the sealing strip advantageously has the shape of an elongated flat U, i.e. the base of the U extends parallel to the long side of the glass plate, whilst the ends of the arms of the U are in contact with the strips 26 and 27, the point of contact being over the groove 24. Accordingly, a zone 30 is formed between the sealing strip 29 and the part of the groove 24 parallel thereto. When the frame 7 and lid 9 are in the closed position (cf. FIG. 2), a resin feed channel 31 provided on the lid 9 is located opposite the said zone 30. The outlet orifice of the channel should as far as possible lie in exactly the same plane as the lower surface of the support 10. The channel 31 can be machined, e.g. milled, directly into the lid 9, but the arrangement shown, in which a resin distribution member 32 which is detachably fastened to the lid 9, is preferred since it enables the resin distribution member 32 to be replaced if resin deposits reduce the cross section of the outlet orifice.

Such a channel 31 can also be subdivided in the longitudinal direction, but this increases the cost of the resin feed devices and control devices therefor. We have found that it is advantageous to introduce the resin from a long side of the printing plate to be produced, as will be described later. Preferably, the channel 31 is arranged on the hinge assembly side of the apparatus. Furthermore, the channel 31 is advantageously provided, at its orifice, with a seal of suitable material, and this seal should preferably be so designed that it opens automatically under the pressure under which the resin is supplied and closes again when this pressure drops, so as to minimize resin losses and soiling of the apparatus when the lid is opened. As is shown in FIGS. 2 and 4, the channel 31 has a single feed line 33 for the fluid resin. However, several feed lines, which may if necessary be provided with suitable valves, can also be used. It is essential that the diameter of the feed line should remain constant under the resin feed pressure and that a pressure-controlled valve should be provided just before the line enters the channel 31, to prevent resin flowing back into the feed line.

On termination of the filling operation, which will be described later, the pressure-controlled valve (not shown in the drawing) closes automatically, immediately after which bending or doming of the support can be effected.

Figure 3:
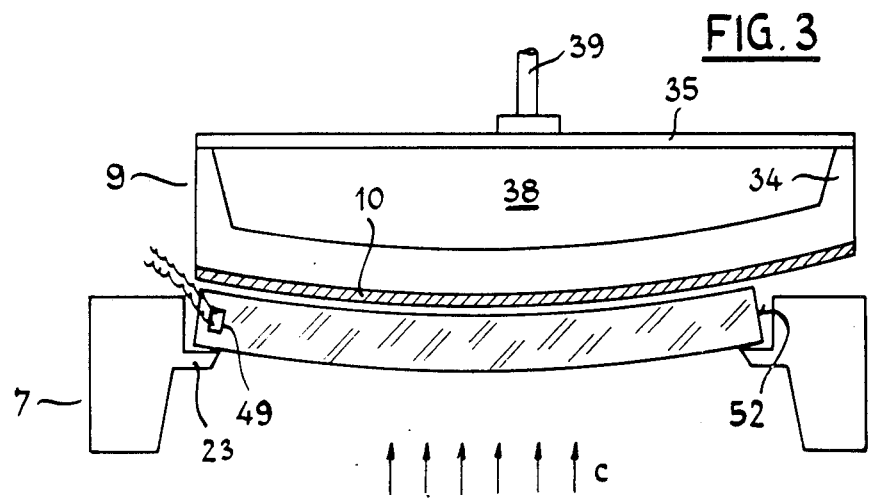
FIG. 3 is a schematic view of the domed pressure plate, support and glass plate shown in FIG. 2.

FIGS. 2 and 3 show a hollow construction of the lid 9 consisting essentially of a pressure plate 34 on which the support 10 is mounted, and a cover plate 35. Vacuum channels 36 arranged in a suitable manner, for example in the form of a grid, are provided on the lid — shown in the raised position in FIG. 1 — in order to ensure that the support lies flat on the pressure plate. If the support 10 is made of ferromagnetic material, magnets can also be used for this purpose. Spring-loaded pins 37 are provided on the pressure plate 34, to facilitate mounting and positioning of the support 10; when the lid is closed, these pins sink into bores, not shown in the drawing. The cavity 38 in the lid 9 can be filled with a heating medium, e.g. air or water, under atmospheric pressure, so as to reduce the viscosity of the resin introduced into the mold; the pressure plate can also be heated electrically. Such a heating medium and/or a pressure medium, e.g. air, is introduced through line 39 attached to the lid 9 (cf. FIGS. 2 and 3); the heating medium leaves the lid via line 39a (cf. FIG. 1). The cover plate 35 is attached to the pressure plate 34 in such a way that a pressuretight seal is formed, so that pressure can be applied to the latter, which results in bending or doming of the support 10 mounted thereon. The plate 34 is made of an elastically deformable material. The support 10 also possesses this latter property if, as is generally the case, it is thin, e.g. 0.5 mm thick, and is made of, for example, steel, aluminum or plastic.

The pressure applied, regardless of the pressure medium or pressure-exerting device used, causes the pressure plate 34 and the support to bend or dome downwardly toward the glass plate 8. The purpose of such bending or doming will be explained later.

As indicated above, closing and locking of the frame 7 and lid 9 must be effected in such a way that they are not distorted, so that a mold of uniform height and hence a layer of uniform thickness is obtained in each production cycle. The mold for the fluid photopolymerizable material is formed, as has been described, by the glass plate 8, spacer strips 26, 27, 28a and 28b and sealing strip 29, and by the support 10 which, when the lid is closed, is pressed against the said strips. A pressure-exerting unit, not shown in the drawing, which acts directly on both the frame 7 and lid 9 and can be actuated by a push button or lever, can also be used to press the frame and lid together with the necessary force. In order to ensure that the members 7 and 9 can be closed and locked together without being distorted, regardless of the thickness of the particular support used, connecting members 19 of the hinge assemblies 17 are provided with pins 40 which are slidably mounted in bushings 41 inserted in bores 42 provided in the lid 9, the bores being at right angles to the lower surface of the pressure plate 34. Screws 43, which engage tapped axial holes in the pins 40, serve to limit, via disc springs 44, vertical movement of the lid (cf. FIG. 2). Since the lid 9 can execute vertical movements as shown by double arrow a, the upper surfaces of the frame 7 and glass plate 8 are always parallel to the lower surface of the pressure plate, regardless of the thickness of the spacer strips.

The film roll holder 12, film guide 15 and slot 16 have already been described above. Before the lid 9 is closed, the film 14 must be spread over the top of the frame, in particular over the spacer strips, the sealing strip and the imagebearing transparency 45 which has beforehand been placed on the glass plate 8, to ensure that they do not come into contact with the resin to be introduced. In addition, the film 14 acts as a seal between the spacer strips and the sealing strip and the support. The film 14 is preferably pulled off the roll by hand. In this operation, it is automatically drawn over the ionization device 13, where static electricity is removed, and laid over the frame 7, so that its leading edge hands slightly over the edge of the frame remote from the film roll. The film is then cut in transverse direction by means of a knife guided in the slot 16. The width of the roll of film is preferably greater than the width of the frame 7 so that any resin which escapes is caught on the film. Vacuum channels are provided to ensure that the film lying inside and over the side walls of the mold is free from creases. A first vacuum channel 46 entirely surrounds the rectangle formed by the spacer strips and the sealing strip, i.e. the mold proper, in spatial relationship thereto, so that when a vacuum is applied the outer zones of the film are held down. A second vacuum channel which is constituted by the groove 24 running round the glass plate is also connected up to the vacuum source, so that when the vacuum is applied the film is held down, free from creases, on the spacer strips and the sealing strip and on the image-bearing transparency over the entire area of the glass plate within said strips. The vacuum channels also serve to evacuate any air caught between the image-bearing transparency 45 and the film 14 and the transparency 45 and the glass plate 8.

The glass plate 8 may be made of commercial twin glass of from 6 to 40 mm thickness, but it is more advantageous to use ground and polished optical glass because it transmits more light of the desired wavelength range and hence makes shorter exposure times possible. The Young's modulus of twin glass is about $60 \times 10^6$ [$N/m^2$], whilst that of optical glass is $80 \times 10^6$ [$N/m^2$]. In the example which is described below, conventional twin glass is used because of the extremely high cost of a sheet of optical glass having a size of, for example, $67 \times 48$ cm$^2$. It is known, and physically demonstrable, that glass is elastically deformable. When pressure is applied to such a glass plate via a medium of low viscosity, the initially flat glass plate bends or domes, the degree of bending or doming depending on the feed pressure used. When pressure is removed, the high elasticity of the glass plate causes the latter to immediately regain its original flat shape to the extent of approximately 99%. This immediate recovery of the glass plate is an indication of its highly elastic behavior. We have found that on subjecting the same glass plate to pressure, using a medium of high viscosity, the recovery of the glass plate is to a large degree determined by the rheological properties of the medium used, i.e. total recovery of the glass plate becomes time-dependent. The settling times can therefore be very long, depending on the viscosity of the medium. If, for example, a resin having a viscosity of 500 cps is applied under a pressure of 0.7 atmosphere gauge to a glass plate having a surface area of $67 \times 48$ cm$^2$ and a thickness of 21 mm, the total setting time is of the order of several minutes. Under these conditions, maximum deflections in the center of the lower surface of the glass plate were found to be from 150 to 180 $\mu$. Consequently, long production cycles are necessary in the case of conventional apparatus for the production of resin layers for printing plates.

In the course of our experiments we have also found that the recovery of the glass plate, after being subjected to pressure via a viscous resin, can be suppressed at least partially, or even completely, by bending or doming the support to the same extent as the glass plate. Depending on the viscosity range of the resin, different degrees of bending or doming of the support, and different forces to achieve this, are required. The time to effect bending or doming of the support can be ascertained by measuring the extent to which the lower surface of the glass plate is deflected from its horizontal position. When doming the support for the production of resin layers for printing plates, it is essential that an equilibrium should be established between the force of recovery of the glass plate and the flow resistance of the resin composition. In such a state of equilibrium, the resin layer has come to rest, so that exposure thereof can be carried out according to the invention. This makes possible the production of printing plates of the same thickness exhibiting a sharp relief image and a flawless printing surface, whilst at the same time shortening the production cycle. In the above example, the size of the glass plate was $67 \times 48$ cm$^2$. Using this glass plate, we have found that, at a resin viscosity of about 500 cps at 24° C and a resin feed pressure of 0.6 atmosphere gauge, the pressure to which the lid must be subjected is 0.35 atmosphere gauge. If smaller resin layers are to be produced, correspondingly smaller glass plates can be used. On the basis of the data mentioned above, equally advantageous results can thus be achieved by either reducing the thickness of the glass plate for a given pressure in the lid or by raising the pressure for a given thickness of glass plate. Accordingly, if a glass plate having a larger surface area is used, it is possible either to increase its thickness or reduce the pressure in the lid.

In particular, use is made of the fact that metals, e.g. aluminum alloys, have approximately the same elastic properties as glass. In practice, the desired result is achieved by doming the pressure plate, which preferably consists of an aluminum alloy and on which the support for the printing plate to be produced is mounted, substantially to the same extent as the glass plate is domed by the resin which has been introduced into the mold, so that the domed state of the glass plate is maintained during exposure.

The nature and properties of the resin used play a very important part in the production of the printing plate, particularly in the mold filling operation. The fluid photopolymerizable resins which can be employed in the process of the invention are conventional fluid resins which can be cured by means of visible or actinic light and which, after photopolymerization, meet the demands placed on printing plates. In particular, mixtures of unsaturated polyesters, unsaturated polyurethane resins and suitable ethylenically unsaturated low molecular weight compounds and a large number of combinations of such mixtures, which combinations are known in the art, can be employed. The viscosities of these resins are generally from 200 to about 5,000 cps at 24° C and a pressure of 760 millibars. Mixtures or combinations of mixtures having a viscosity of from about 300 to 1,000 cps have proved particularly advantageous.

Depending on the viscosity of the fluid resin used, the pressure used to fill the mold with resin is from about 0.1 to 2 atmospheres gauge, preferably from 0.3 to 1.5 atmospheres gauge. The flow of resin on the glass plate 8 which is obtained under these conditions is shown schematically in FIG. 4 (line b). The resin introduced under pressure brings about a considerable increase in the volume of the mold because the glass plate and pressure plate are domed outwardly away from each other, so that the filling operation, which terminates when the filling valve, not shown in the drawing, closes, only takes a relatively short time — cf. the comments made below on the duration of the individual operations.

To ensure that the filling valve closes after a predetermined amount of resin has passed through it, an accurate resin metering device is required. Such metering devices are, for example, piston metering devices which are commercially available and need therefore not be described in more detail. The requisite filling pressure can conveniently be produced by a pneumatic device. The metering device and pneumatic device are suitably connected to the feed line 33.

As FIG. 4 shows, the resin is gradually distributed from the feed channel 31 over the surface of the film on the glass plate, arrows A showing the direction of flow. To ensure that the flow of resin is opposed by a sufficiently high force at gaps 47 and 48, the widths B are small and are, in the case of spacer strips 0.5 mm thick, from about 0.1 to 2 mm, preferably from 0.5 to 1 mm; only in exceptional cases, for example if there is a sudden drop in the viscosity of the resin, do these gaps serve as emergency outlets for the resin. In other words, when the center of the front of fluid resin comes into contact with the strips 28a and 28b or, rather, the film thereon, the resin spreads along the strips and is held up at the gaps (which are of such size as to permit the air to escape from the mold), provided that the tolerance on the amount of resin introduced is very small. The metering device, referred to earlier, is so set that the amount of resin introduced into the mold is just slightly larger than the amount required to completely fill the mold. Depending on the size of the printing plate to be produced, this means that the amount of resin introduced is at most 0.5 to 1% greater, i.e. negligibly greater, than the amount required to produce the photopolymerizable layer. As a result, the design of the apparatus is simplified and the cycle time is shortened.

In FIG. 3, the lid 9 and frame 7 are shown in the closed position after the resin filling operation is over and the glass plate has settled to the necessary extent. At this point in time, the means for supplying the pressure medium under pressure to effect doming of the pressure plate is in operation, the pressure medium being introduced into the interior 38 of the lid 9 through line 39. As stated above, a pressure of about 0.35 atmosphere gauge is preferred if the pressure plate 34 is made of aluminum alloy, for example in the form of a casting.

If the pressure plate is made of some other material of the same thickness as aluminum, the pressure to be applied thereto can be suitably determined from the degree of doming of the glass plate, and can then be suitably produced. The parallel arrows C shown below the glass plate 8 in FIG. 3 are intended to indicate that the light source 11 is on when the lower surface of the pressure plate 34 has undergone convex deformation, as described, and the upper surface of the glass plate 8 has undergone concave deformation. As shown in the drawing, it is essential that the dome shape of the support should match as precisely as possible the dome shape of the glass plate to ensure that a layer of resin of uniform thickness is obtained in the mold.

Doming of the pressure plate and of the support mounted thereon, described above, firstly distributes the resin introduced very uniformly within the mold and, secondly, prevents settling of the glass plate during exposure of the resin layer.

The importance of the duration of each operation in the manufacture of a printing plate has only been touched upon in the foregoing description. By way of example, the time each platemaking step takes is given below for a relief height of 0.55 mm, a resin viscosity of 500 cps at 24° C, and a filling pressure of 0.6 atmosphere gauge:

1. Placing the negative on the glass plate, $t_1$ = about 4 to 7 sec.
2. Placing the film in position, and cutting it, $t_2$ = about 10 to 12 sec.
3. Placing the support in position, $t_3$ = from 10 to 15 sec.
4. Closing and locking the lid, $t_4$ = 7 sec.
5. Introducing the resin by means of a metering device, $t_5$ = 32 sec.
6. Applying a pressure of 0.35 atmosphere gauge to the pressure plate to distribute the predetermined amount of resin in the mold and produce a resin layer of uniform thickness, $t_6$ = 30 sec.
7. Exposure time, $t_7$ = from 20 to 35 sec.
8. Time to open the lid, $t_8$ = 6 sec.
9. Taking out the exposed plate, $t_9$ = from 8 to 12 sec.

From this, the total cycle time is calculated to be at least 123 sec and at most 139 sec, depending on the skill of the operator. Accordingly, for operators of average skill, the mean cycle time is 131 seconds. By contrast, with conventional processes and apparatus the minimum cycle time is about 200 seconds if the film is placed in position automatically; it should be noted that in the example given here the film is placed in position, and cut, manually. It is immediately apparent that the time it takes to produce a printing plate using the process and apparatus of the invention is about onethird shorter than the cycle times of conventional processes and apparatus.

After exposure of the resin layer and before opening the lid, the pressure in the lid can be reduced, for example, to 0.15 atmosphere gauge, and the vacuum which holds the support is released. The exposed blank plate, the exposed areas of which are now firmly bonded to the support by the layer of conventional adhesive applied to the support, can then be removed from the mold together with the film. After removal of the film, the plate is ready for further processing, e.g. afterexposure, washout and drying.

It is clear from what has been stated above that the elastic properties of the glass plate are of particular importance. These properties also vary with temperature; it has been found that the glass plate becomes relatively warm if the apparatus is used frequently, this being attributable to the absorption of light energy during exposure.

In principle, it is possible to measure the degree of doming of the glass plate, continuously or periodically, by using, for example, strain gauges, marked 49 in FIG. 3, for control purposes. It is thus possible, for example, to apply pressure to the lid at the correct point in time or to vary the applied pressure slightly, say, in order to further shorten the time it takes a resin layer of uniform thickness to form over the entire surface of the glass plate. The degree of doming of the glass plate which occurs when resin is filled into the mold can also be measured indirectly, for example by means of a photocell arrangement, and used for control purposes as described above. FIG. 3 also shows schematically a thermocouple 52 for directly measuring the temperature of the glass plate. Since the temperature of the glass plate causes the temperature of the resin solution in the mold to rise, the thermocouple can be used to control the means for heating the resin (if present). It is thus possible to ensure that the viscosity of the resin in the mold remains constant so that approximately the same conditions are obtained during each production cycle.

We claim:

1. An apparatus for the production of exposed printing plates comprising a mold having a first wall formed by the support of the printing plate to be produced and a second wall formed by a glass plate covered with an image-bearing transparency; means for introducing a predetermined amount of a fluid photopolymerizable material under pressure into the mold, said predetermined amount substantially corresponding to the volume of the resin layer of the exposed printing plate to be produced; first and second members which are movable relative to one another, said first member carrying the glass plate and said second member carrying the support, movement of the said two members toward each other serving to close said mold; at least one source of actinic radiation located in such a way that the layer of fluid photopolymerizable material can be exposed through the glass plate; and means provided on the said second member for so adjusting the support that the latter's surface is equidistant from the surface of the glass plate, and maintaining the distance between the said two surfaces during exposure of the layer of fluid photopolymerizable material, said introducing means introducing the fluid photopolymerizable material into the mold under pressure, which causes the glass plate to bend or dome outwardly of the mold, and said support-adjusting means consists for so bending or doming the support that its bent or domed surface is equidistant from the bent or domed surface of the glass plate, and for maintaining the distance between the said two surfaces during exposure of the fluid photopolymerizable material through the glass plate using said source of actinic radiation.

2. An apparatus as claimed in claim 1, wherein the second member is a hollow body whose cavity is connected to pressure-producing means.

3. An apparatus as claimed in claim 2, wherein the second member consists of a material of which the modulus of elasticity approximately corresponds to that of the material of the glass plate.

4. An apparatus as claimed in claim 3, wherein the second member is made of an aluminum alloy.

5. An apparatus as claimed in claim 1, wherein the first and second members are connected to one another so that they can be folded onto one another and be positively locked to one another.

6. An apparatus as claimed in claim 1, which includes a sealing strip and several optionally detachable spacer strips located on the glass plate, said sealing strip and said spacer strips forming the side walls of the mold for the fluid photopolymerizable material which is to be introduced, and at least one feed channel for the fluid photopolymerizable material, on the second member, wherein the sealing strip is located in the immediate vicinity of the feed channel when the members are in the closed position, and the spacer strips, which form a rectangle with the sealing strip, are strips of conventional spring steel of the same thickness, the spacer strip which is parallel to the sealing strip being composed of one or more strips arranged next to each other, and gaps for allowing the air to escape from the mold being provided at each end of the said spacer strip and between adjacent pairs of strips.

7. An apparatus as claimed in claim 5, wherein the first and second members are connected by hinge means comprising a rod fixed to the first member and two connecting members each provided with a swing bearing and being pivotable about the rod, the connecting members being provided with pins which are slidably guided in bores in the second member.

8. An apparatus as claimed in claim 1, wherein, a pneumatically, operated closing and opening mechanism is provided between the first and second members, together with a mechanism for locking the members which is optionally coupled to the closing and opening mechanism.

9. An apparatus as claimed in claim 1, wherein a feed channel is provided on the second member, the feed channel being located within the rectangle formed by the sealing strip and the spacer strips when the two members are in the closed position, and preferably being provided with a resin distribution member which is preferably detachably connected to the second member.

10. An apparatus as claimed in claim 1, wherein a vacuum channel is provided around the periphery of the glass plate in the first member.

11. An apparatus as claimed in claim 10, wherein the said vacuum channel contains an elastic profile which acts as a seal and correctly positions the glass plate.

12. An apparatus as claimed in claim 10, wherein a further vacuum channel completely surrounds the rectangle, formed by the spacer strips and the sealing strip, at a distance therefrom and is also rectangular in shape.

13. An apparatus as claimed in claim 6, wherein lengths of double-sided adhesive tape are provided between the glass plate and the spacer strips, gaps being provided between the lengths of tape for the evacuation of air.

14. An apparatus as claimed in claim 1, wherein a holder for a roll of plastics film and an ionization device for freeing the film which is to be unrolled from static electricity are provided on the first member.

* * * * *